United States Patent
Park

(10) Patent No.: US 7,719,918 B2
(45) Date of Patent: May 18, 2010

(54) SEMICONDUCTOR MEMORY DEVICE HAVING INPUT/OUTPUT SENSE AMPLIFICATION CIRCUIT WITH REDUCED JUNCTION LOADING AND CIRCUIT LAYOUT AREA

(75) Inventor: Ki Chon Park, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 150 days.

(21) Appl. No.: 11/775,929

(22) Filed: Jul. 11, 2007

(65) Prior Publication Data

US 2008/0198680 A1    Aug. 21, 2008

(30) Foreign Application Priority Data

Feb. 15, 2007    (KR) .................. 10-2007-0016245

(51) Int. Cl.
*G11C 8/00* (2006.01)
(52) U.S. Cl. ..................... 365/230.03; 365/230.06; 365/189.05; 365/191; 365/193

(58) Field of Classification Search ............ 365/230.03, 365/230.06, 191, 193, 189.05, 185.23, 196, 365/185.13, 189.08
See application file for complete search history.

(56) References Cited

U.S. PATENT DOCUMENTS 6,944,092 B2 * 9/2005 Kang ..................... 365/233.13
2006/0023536 A1 * 2/2006 Cho ........................... 365/206

FOREIGN PATENT DOCUMENTS

KR    1020060010191    2/2006

* cited by examiner

*Primary Examiner*—Pho M Luu
*Assistant Examiner*—Tha-O Bui
(74) *Attorney, Agent, or Firm*—Ladas & Parry LLP

(57) ABSTRACT

A semiconductor memory device includes a plurality of sense amplifiers that amplify data transferred from each of a couple of banks and output them as amplified signals; a controller configured to determine the output states of the amplified signals outputted from each of the couple of sense amplifiers and to output driving signals corresponding to the output amplified signals; and a driver configured to receive driving signals and to drive a global input/output line in response to the driving signals, wherein the couple of sense amplifiers share the one driver.

17 Claims, 6 Drawing Sheets

FIG.1

| BA0 | | BA1 | BA0 | | BA1 |
|---|---|---|---|---|---|
| BA2 | | BA3 | BA2 | | BA3 |
| BA4 | IOSA | BA5 | BA4 | IOSA | BA5 |
| BA6 | | BA7 | BA6 | | BA7 |
| DQ0~DQ7 | | | DQ24~DQ31 | | |
| DQ8~DQ15 | | | DQ16~DQ23 | | |
| BA0 | | BA1 | BA0 | | BA1 |
| BA2 | | BA3 | BA2 | | BA3 |
| BA4 | IOSA | BA5 | BA4 | IOSA | BA5 |
| BA6 | | BA7 | BA6 | | BA7 |

(PRIOR ART)

(PRIOR ART)

(PRIOR ART)

SEMICONDUCTOR MEMORY DEVICE HAVING INPUT/OUTPUT SENSE AMPLIFICATION CIRCUIT WITH REDUCED JUNCTION LOADING AND CIRCUIT LAYOUT AREA

CROSS-REFERENCE TO RELATED APPLICATIONS

The present application claims priority to Korean patent application number 10-2007-0016245 filed on Feb. 15, 2007, which is incorporated herein by reference in its entirety.

BACKGROUND OF THE INVENTION

The present invention relates to a semiconductor memory device, and more specifically to a semiconductor memory device including an input/output sense amplifier that amplifies a read data and provide it to the external, when making a read operation.

In general, data stored in a memory cell of a semiconductor memory device is transferred to an input/output sense amplifier via any one of a pair of local input/output lines when a read command is inputted in a read operation.

And, the transferred data is amplified by the input/output sense amplifier and then outputted via a global input/output line.

A semiconductor memory device may have a structure of two banks that are arranged symmetrically to each other with respect to the input/output sense amplifier arranged therebetween the two banks. When the data stored in one of the above two banks is transferred to the global input/output line in a read operation, the input/output sense amplifier for the remaining bank should remain floating with the global input/output line.

FIG. 1 shows one example of a graphic memory structure divided into four quarters. In one quarter (e.g., upper left quarter of FIG. 1), eight banks BA0 to BA7 are arranged such that one set of four banks BA0, BA2, BA4, BA6 and the other set of four banks BA1, BA3, BA5, BA7 are laid out symmetrically to each other with one-to-one relation between each symmetrically arranged banks. An input/output sense amplifying circuit IOSA is arranged therebetween the two sets of banks. Another set of eight banks DQ0 to DQ7 is also arranged in the same upper left corner of FIG. 1. The input/output sense amplifier disposed between the two banks BA0 and BA1 can be represented as shown in FIG. 2.

Referring to FIG. 2, two input/output sense amplifiers 10, 20 are shown therein. The input/output sense amplifier 10 corresponds to the bank BA0, and the input/output sense amplifier 20 corresponds to the bank BA1. Both input/output sense amplifiers 10, 20 are connected to a global input/output line RGIO. Each input/output sense amplifiers 10, 20 comprises sense amplifiers 11, 21, inverters IV1, IV2, and drivers 12, 22, respectively.

With such structure, to read data stored in the bank BA0, the data stored in the bank BA0 is transferred to the sense amplifier 11 via any one of a pair of local input/output lines LIO0 and LIO0B, the sense amplifier 11 is turned-on by a strobe signal IOSA_STROBE0 to amplify the inputted data and outputs an amplified signal D0 and an inverted amplified signal D0B.

And, the inverted amplified signal D0B is inverted by the inverter IV1, and as the amplified signal D0 and the signal inverted by the inverter IV1 are inputted to the driver 12, the driver is turned-on to transfer a high or low level of data to the global input/output line RGIO. After this, the data transferred to the global input/output line RGIO is latched through a latch LAT.

While the bank BA0 is accessed to read data, the sense amplifier 21 is turned-off by the strobe signal IOSA_STROBE0, and the driver 22 is turned-off by the amplified signal D1 and the output signal of the inverter IV2 to allow the output stages of the global input/output line RGIO and the driver 22 to be floated.

It is noted that all banks BA0 to BA7 commonly use the global input/output line RGIO. When reading the bank BA0, for example, the output stage of the global input/output line RGIO and the driver 22 are floated, in order to prevent the influence from the input/output sense amplifiers of the remaining banks (such as BA1 to BA7) on the data that is read from a specific bank (such as BA0).

In other word, as shown in FIG. 3, when reading the bank BA0, only the driver 12 of the BA0 is turned-on and the drivers corresponding to the remaining banks BA1 to BA7 are floated together with the global input/output line RGIO so that all the drivers corresponding to the remaining banks BA1 to BA7 have no effect on the operation of reading the bank BA0.

However, when all drivers for the banks BA0 to BA7 are commonly connected to the global input/output line as shown in FIG. 3, a junction loading can occur due to the remaining seven drivers of BA1 to BA7 (besides the driver 12 corresponding to the bank BA0) causing deterioration of the slop of the data carried by the global input/output line RGIO.

When the slop of the data carried on the global input/output line RGIO is deteriorated, the time 'tAA' required for inputting the command and then outputting the data increases, thereby causing problems of decreased operating speed of the memory device.

Also, as the drivers included in the respective sense amplifier generally drive the long global input/output line RGIO, the size of each driver is rather large. When the large-sized drivers are disposed in every bank of BA0 to BA7 as shown in FIG. 3, the layout area required for the drivers in the semiconductor memory device becomes a serious problem.

SUMMARY OF THE INVENTION

Accordingly, the present invention reduces the time required for inputting a command and then outputting a data by reducing a junction loading of input/output sense amplifiers connected to global input/output lines, when making a read operation.

Also, the present invention reduces a layout area occupied by a driver in a semiconductor memory device by reducing the number of large-sized drivers included in an input/output sense amplifier.

According to one aspect of the present invention, there is provided a semiconductor memory device including a plurality of sense amplifiers that amplify data transferred from each bank and output them as amplified signals, the semiconductor memory device including: a controller that judges the output states of the amplified signals in each sense amplifier to output driving signals corresponding to the output amplified signals; and a driver that drives an global input/output line with the driving signal.

Preferably, the driver is floated together with the global input/output line by the driving signal when the sense amplifiers are turn-off and is driven by the driving signal when the amplified signal is transferred from any one of the sense amplifiers.

Preferably, the respective sense amplifiers amplify a pair of data transferred from the respective banks, and the controller combines first and second amplified signals output from a first sense amplifier corresponding to a first bank of the banks and third and fourth amplified signals output from a second sense amplifier corresponding to a second bank to output them as first and second driving signals.

Preferably, at this time, the second amplified signal is a signal opposite to the first amplified signal in view of a phase and the fourth amplified signal is a signal opposite to the third amplified signal in view of a phase.

Preferably, the controller outputting the first and second driving signals includes a first combination unit that enables the first driving signal by way of a logic combination of the second and fourth amplified signals when the second and fourth amplified signals are in a first logic level; and a second combination unit that enables the second driving signal by way of a logic combination of the first and third amplified signals when the first and third amplified signals are in the first logic level.

Preferably, in the constitution of the controller, the first combination unit includes a first NAND gate that NAND-combines the second and fourth amplified signals to output it as the first driving signal.

Preferably, the second combination unit includes a second NAND gate that NAND-combines the first and third amplified signals; and an inverter that outputs the second driving signal by inverting the output of the second NAND gate.

Preferably, the driver includes a pull-up unit that pulls-up the global input/output line to a power source voltage level in response to the first driving signal; and a pull-down unit that pulls-down the global input/output line to a ground voltage level in response to the second driving signal.

Preferably, in the constitution of the driver, the pull-up unit includes a PMOS transistor that rises the global input/output line to the power source voltage level in response to the first driving signal and the pull-down unit includes an NMOS transistor that falls the global input/output line to the ground voltage level in response to the second driving signal.

Preferably, the first and second banks are arranged to be symmetrical to each other based on the arrangement region of the input/output sense amplifying circuit in which the first and second sense amplifiers are disposed.

Preferably, the plurality of drivers share the one global input/output line, the global input/output line being provided with a latch.

According to another aspect of the present invention, there is provided a semiconductor memory device including: an input/output sense amplifying circuit having a plurality of drivers; and a plurality of banks arranged to be symmetrical to each other, putting the input/output sense amplifying circuit therebetween, wherein the respective drivers are preferably shared in a pair of banks arranged to be symmetrical to each other among the plurality of banks.

Preferably, the plurality of drivers shares one global input/output line, and the respective drivers are floated together with the global input/output lines when data are not transferred from the pair of banks shared and drive the global input/output lines when the data are transferred from any one of the pair of banks shared.

Preferably, the global input/output line is further provided with a latch.

Preferably, the input/output sense amplifier further includes a plurality of first sense amplifiers that amplify a first data transferred from any one of the pair of banks to provide it as a first amplified signal; a plurality of second sense amplifiers that amplify a second data transferred from the other of the pair of banks to provide it as a second amplified signal; and a plurality of controllers that judge the output states of the first and second amplified signals to generate first and second driving signals corresponding to the output amplified signals; wherein the respective drivers drive the global input/output lines with the first and the second driving signals.

Preferably, at this time, the respective controller generates the first and second driving signals corresponding to the first data when the first amplified signal is enabled and the first and second driving signals corresponding to the second data when the second amplified signal is enabled, by way of a combination of the first and second amplified signals.

Preferably, in the constitution of the input/output sense amplifying circuit, the respective drivers include a pull-up unit that pulls-up the global input/output line to a power source voltage level in response to the first driving signal; and a pull-down unit that pulls-down the global input/output line to a ground voltage level in response to the second driving signal.

Preferably, in the constitution of the respective drivers, the pull-up unit includes a PMOS transistor that rises the global input/output line to the power source voltage level in response to the first driving signal and the pull-down unit includes an NMOS transistor that falls the global input/output line to the ground voltage level in response to the second driving signal.

Preferably, each of the plurality of banks is arranged in a bank region divided into a quarter centering on the regions where input/output pads of a center are arranged.

BRIEF DESCRIPTION OF THE DRAWINGS

FIG. 1 shows arrangement of memory banks and input/output sense amplification circuits in a semiconductor memory device.

DESCRIPTION OF SPECIFIC EMBODIMENTS

Hereinafter, preferred embodiments of the present invention will be described in detail with reference to the accompanying drawings.

Embodiments of the present invention allow input/output sense amplifiers, each corresponding to a plurality of banks, to share one driver, making it possible to reduce 'tAA' and get an advantage of optimized circuit layout area.

The memory bank and input/output sense amplifier structure shown in FIG. 1 will be referenced with respect to an embodiment of the present invention. In FIG. 1, the bank region is divided into four quarters centering on the regions DQ0 to DQ23 where input/output pads are arranged. A plurality of banks BA0 to BA7 are arranged in each quarter region to have one-to-one correspondence in a symmetrical manner with respect to the input/output sense amplifying circuit IOSA in each quarter.

Figure 2:
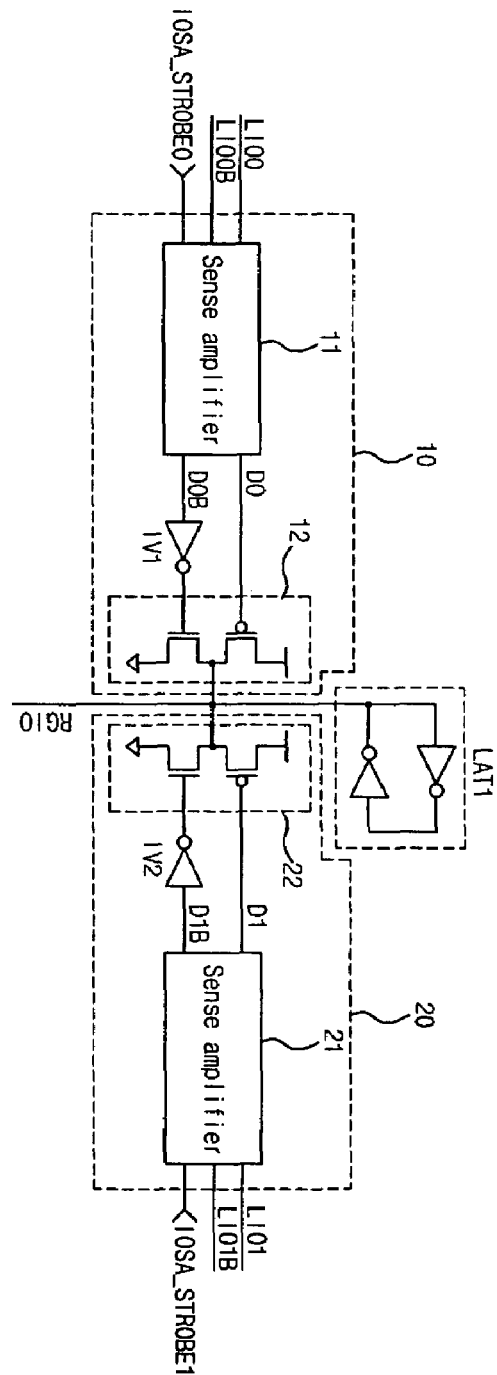
FIG. 2 is a circuit diagram showing two input/output sense amplifiers 10, 20 disposed in between two symmetrically arranged banks BA0 and BA1 shown in FIG. 1 according to prior art.
Figure 3:
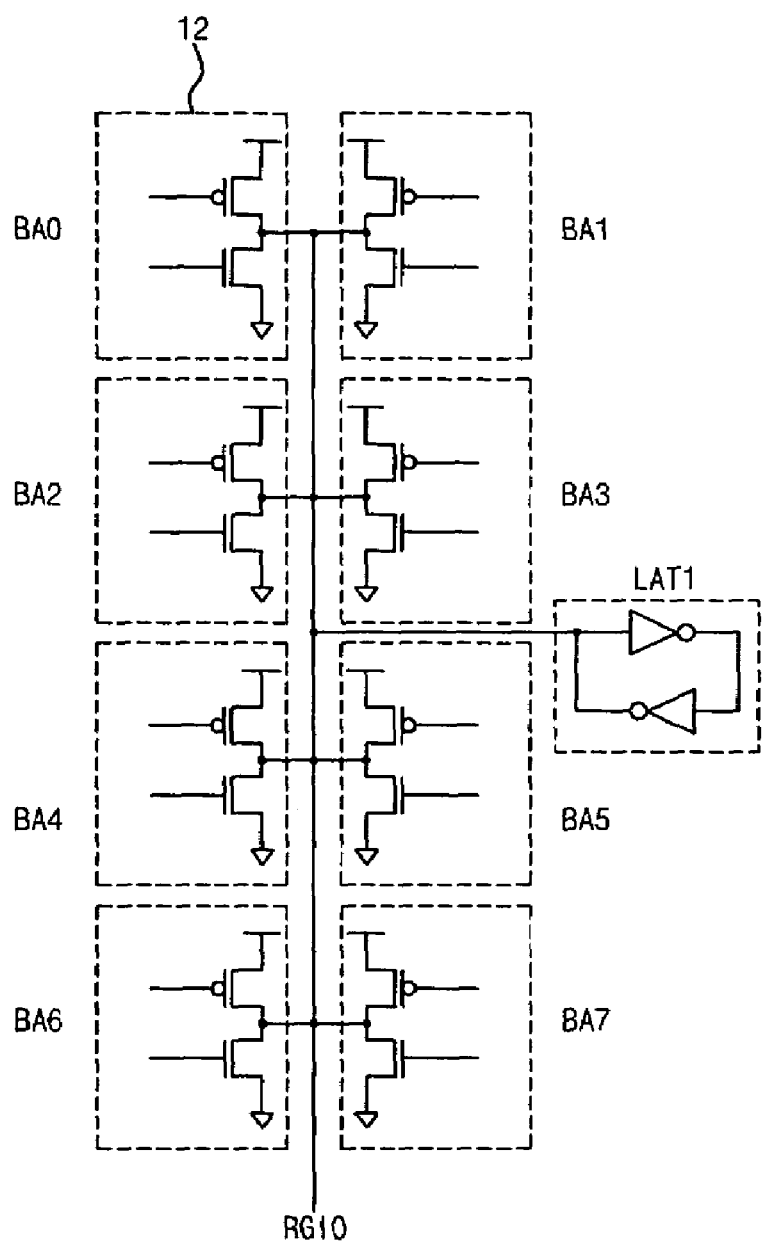
FIG. 3 is a circuit diagram showing drivers disposed between one group of four banks BA0, BA2, BA4, BA6 and the other group of four banks BA1, BA3, BA5, BA7 showed in FIG. 1 according to prior art.
Figure 4:
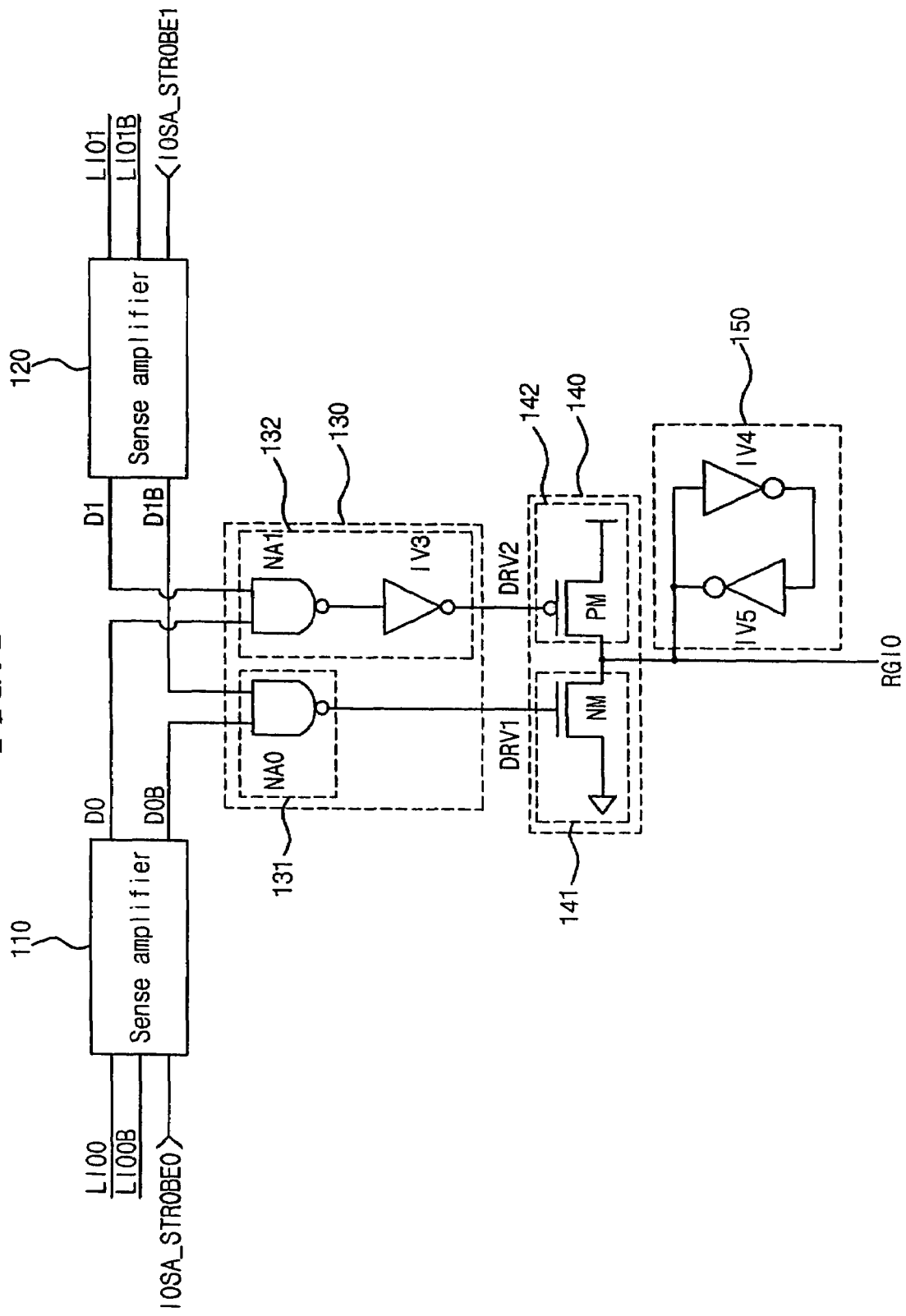
FIG. 4 is a circuit diagram of an input/output sense amplifier disposed between two banks arranged to be symmetrical to each other according to an embodiment of the present invention.

Shown in FIG. 4 according to an embodiment of the present invention include two sense amplifiers 110, 120 that amplify the read data transferred from two corresponding banks arranged to be symmetrical to each other (for example, BA0 and BA1 of FIG. 1); a controller 130 that determines data output states of the two sense amplifiers 110, 120 and outputs driving signals DRV1, DRV2 to correspond to the outputted data; a driver 140 that drives a global input/output line RGIO based on the driving signals DRV1, DRV2; and a latch unit 150 that latches the data transferred to the global input/output line RGIO. Herein, the input/output sense amplifying circuit according to an embodiment of the present invention can be defined to include the sense amplifiers 110 and 120, the controller 130, and the driver 140.

The sense amplifier 110 senses and amplifies the potential difference between a pair of local input/output lines LIO0, LIO0B in response to a strobe signal IOSA_STROBE0 and outputs the amplified signals D0, D0B when the data are transferred from the corresponding bank to any one of the pair of local input/output lines LIO0 and LIO0B.

Likewise, the sense amplifier 120 senses and amplifies the potential difference between the pair of local input/output lines LIO0 and LI1B in response to the strobe signal IOSA_STROBE1 and outputs the amplified signals D1, D1B when the data are transferred from the corresponding bank to any one of the pair of local input/output lines LIO1, LIO1B.

Herein, the two sense amplifiers 110, 120 are disposed between the two banks arranged to be symmetrical to each other to amplify the data transferred from the respectively connected banks.

The controller 130 includes two combination units 131, 132 that combines the amplified signals D0, D1 and the inverted amplified signals D0B, D1B, respectively, to output them as the driving signals DRV1, DRV2, wherein the combination unit 131 enables the driving signal DRV1 when the inverted amplified signals D0B, D1B are in a first logic level, and the combination unit 132 enables the driving signal DRV2 when the amplified signals D0, D1 are in the first logic level.

For example, the combination unit 131 may comprise an NAND gate NA0 that NAND-combines the amplified signals D0B, D1B and outputs the driving signal DRV1, and the combination unit 132 may comprise an NAND gate NA1 that NAND-combines the amplified signals D0, D1 and an inverter IV1 that inverts the signal outputted from the NAND gate NA1, thereby outputting the driving signal DRV2.

The driver 140 is floated together with the global input/output line RGIO in accordance with the driving signals DRV1, DRV2 or transfers high or low level data to the global input/output line RGIO. The driver 140 may comprise a pull-down unit 141 and a pull-up unit 142.

For example, the pull-down unit 141 may comprise an NMOS transistor NM that pulls-down the global input/output line RGIO to a ground voltage level in response to the driving signal DRV1, and the pull-up unit 142 may comprise a PMOS transistor PM that pulls-up the global input/output line RGIO to a power source voltage level in response to the driving signal DRV2.

The latch unit 150 latches the state of the global input/output line RGIO and may comprise an inverter IV4 that inverts the signal of the global input/output line RGIO and an inverter IV5 that inverts the signal output from the inverter IV4 to output it to the global input/output line RGIO.

Figure 5:
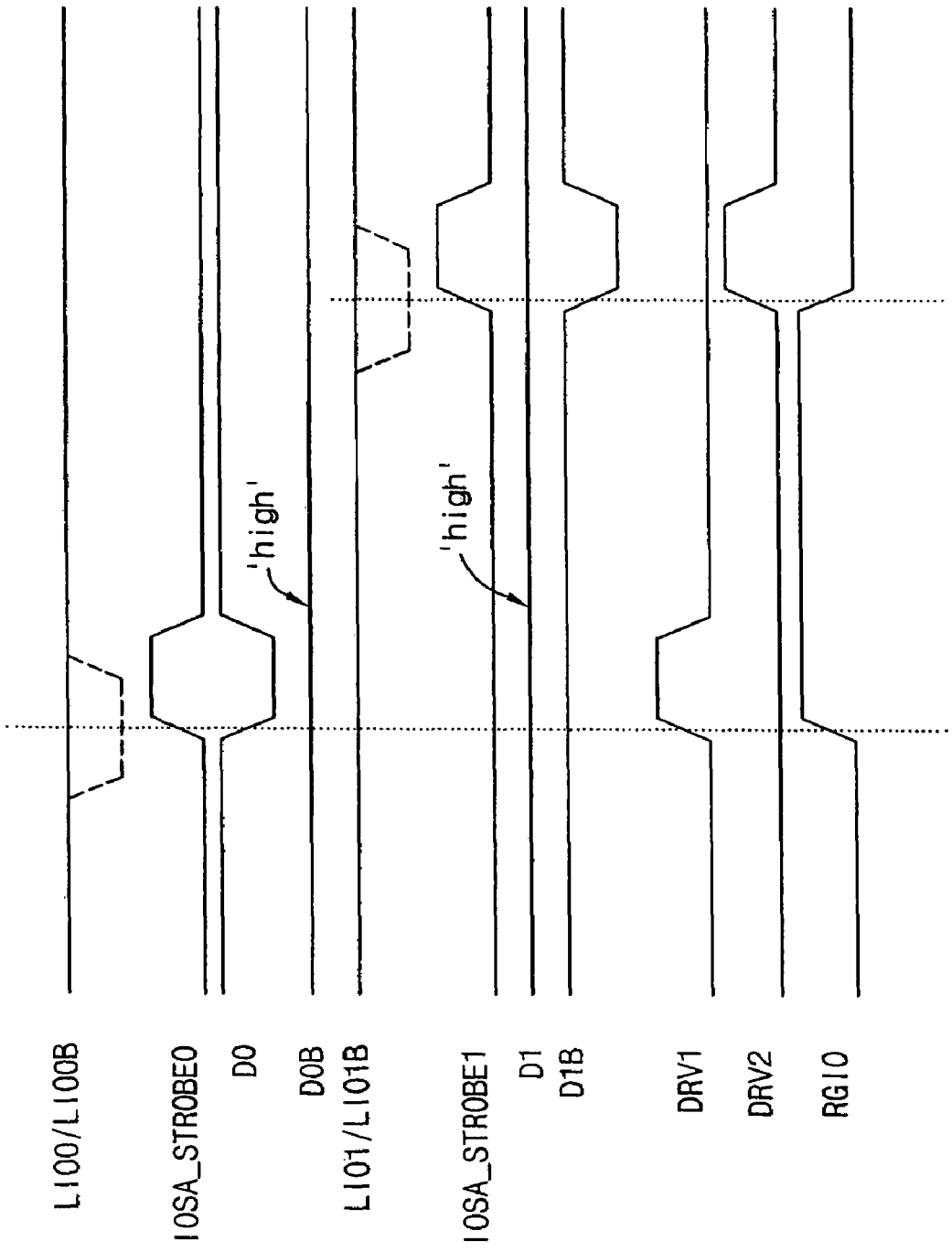
FIG. 5 is a waveform diagram in connection with operation of the circuit shown in FIG. 4.

The operations of the device according to an embodiment of the present invention will be described in detail with reference to FIG. 5.

First, when no bank is inputted with a read command, all the amplified signals D0, D0B, D1, D1B outputted from the two sense amplifiers 110, 120 are maintained in a high state.

Accordingly, the driving signal DRV1 outputted from the controller 130 is in a low level, and the driving signal DRV2 is in a high level, so that the driver 140 is floated together with the global input/output line RGIO.

Next, when a read command is inputted to any one of the two banks symmetrically arranged to each other to transfer the data to the pair of local input/output lines LIO0, LIO0B, the strobe signal IOSA_STROBE0 is enabled to turn-on the sense amplifier 110.

Accordingly, the amplified signal D0 and the inverted amplified signal D0B outputted from the sense amplifier 110 are amplified at different levels. As shown in FIG. 5 for example, the amplified signal D0 is in a low level, while the inverted amplified signal D0B is in a high level.

And, the amplified signals D1, D1B outputted from the sense amplifier 120 are still maintained in a high level.

The controller 130 NAND-combines a high level of the amplified signal D0B and a high level of the inverted amplified signal D1B and outputs a low level of the driving signal DRV1, and the controller 130 also NAND-combines a low level of the amplified signal D0 and a high level of the amplified signal D1 and then inverts the outputted signal as a low level of the driving signal DRV2.

The PMOS transistor PM in the driver 140 pulls-up the global input/output line RGIO to a high level based on the driving signals DRV1, DRV2. Therefore, a high level of data is transferred to the global input/output line RGIO.

Subsequently, when the read command is inputted to any one of the two banks symmetrically arranged to each other to transfer the data to the pair of local input/output lines LIO1, LIO1B, the strobe signal IOSA_STROBE1 is enabled to turn-on the sense amplifier 120.

Accordingly, the amplified signal D1 and the inverted amplified signal D1B outputted from the sense amplifier 120 are amplified at different levels. As shown in FIG. 5 for example, the amplified signal D1 is in a high level while the inverted amplified signal D1B is in a low level.

And, the amplified signals D0, D0B outputted from the sense amplifier 110 are maintained in a high level.

The controller 130 NAND-combines a high level of the amplified signal D0B and a low level of the inverted amplified signal D1B and outputs a high level of the driving signal DRV1, and also the controller 130 NAND-combines a high level of the amplified signal D0 and a high level of the amplified signal D1 and then inverts the outputted signal as a high level of the driving signal DRV2.

The NMOS transistor NM in the driver 140 pulls-down the global input/output line RGIO to a low level based on the driving signals DRV1, DRV2. Therefore, a low level of data is transferred to the global input/output line RGIO.

Figure 6:
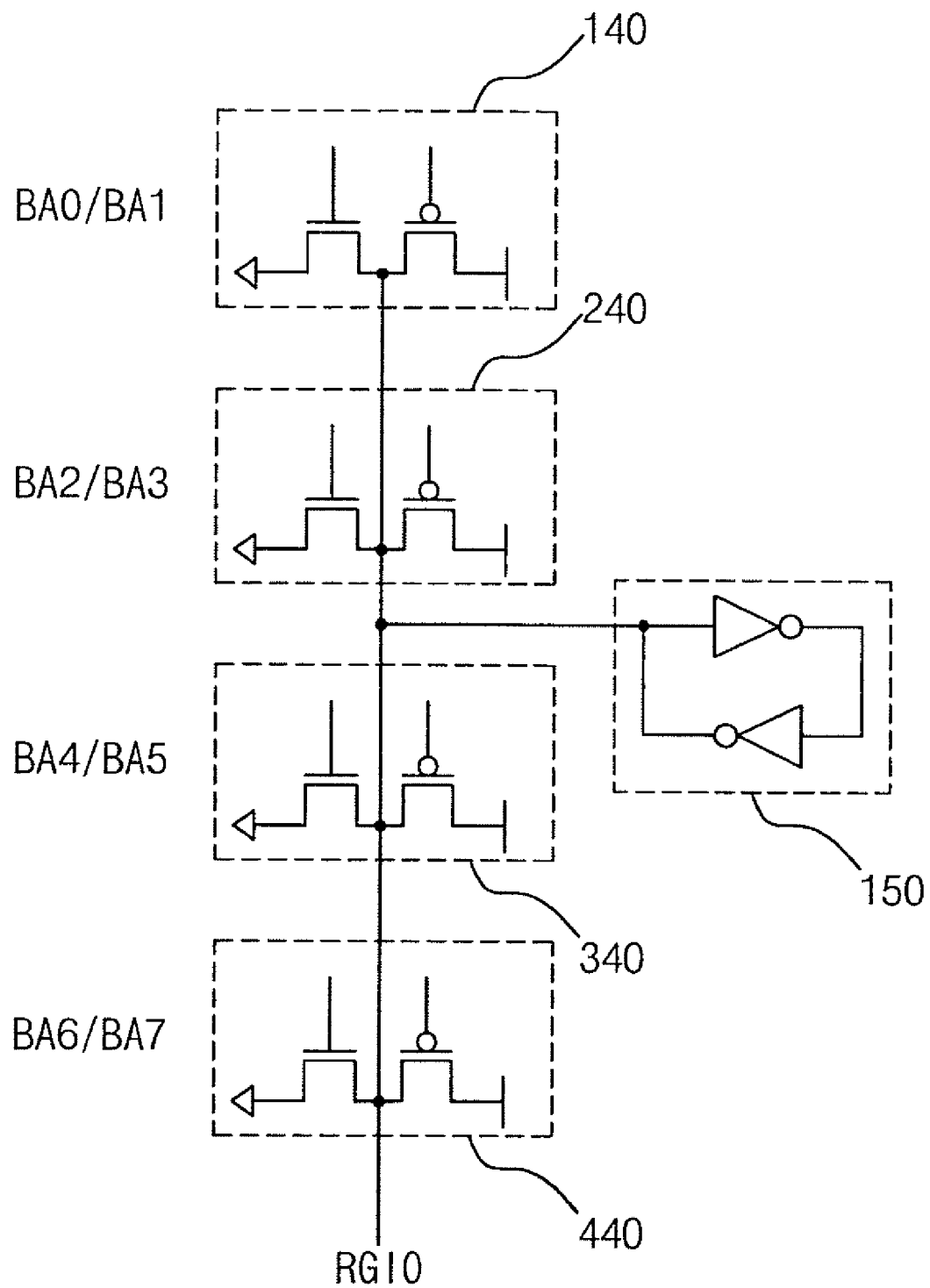
FIG. 6 is a circuit diagram showing drivers 140, 240, 340, 440 disposed between a group of four banks BA0, BA2, BA4, BA6 and the another group of four banks BA1, BA3, BA5, BA7 according to an embodiment of the present invention.

FIG. 6 shows the layouts of the drivers 140, 240, 340, 440 according to an embodiment of the present invention where four banks BA0, BA2, BA4, BA6 are symmetrically arranged to four banks BA1, BA3, BA5, BA7, respectively.

As shown in FIG. 6, in an embodiment of the present invention, the two symmetrically arranged banks (for example, BA0, BA1) are connected to share one driver 140 such that, even in the structure having the eight banks, the read operation can be performed normally using only the four drivers 140, 240, 340, 440.

Accordingly, when reading the bank BA0 in an embodiment of the present invention, only the driver 140 is operated and all the remaining drivers 240, 340, 440 are floated together with the global input/output line so that only the junction loadings due to the three drivers 240, 330, 440 occur, thereby making it possible to improve a signal slop of the global input/output line RGIO.

In other words, the conventional devices having the structure of eight banks require that drivers should be disposed in every bank of BA0 to BA7, by which junction loadings due to all of the seven drivers will occur. However, in an embodiment of the present invention, the two symmetrically arranged banks (for example, BA0, BA1) share one driver 140 so that only the junction loadings due to the three drivers 240, 340, 440 occur.

With the reduction of the junction loading, the present invention improves the signal slop of the global input/output line RGIO and thus reduces the time 'tAA' required for inputting the command and outputting the data to improve an operation speed of a memory.

Also, in the prior art, the drivers should be disposed in every bank BA0 to BA7 requiring that all of the eight drivers should be disposed. However, in the present invention, the two symmetrically arranged banks (for example, BA0, BA1) share the one driver 140 so that the read operation can normally be performed using only all the four drivers 140, 240, 340, 440.

Therefore, an embodiment of the present invention reduces the layout area occupied by the input/output sense amplifier in the semiconductor memory device, thereby making it possible to improve a net die.

As above, the present invention has an effect that input/output sense amplifiers each corresponding to a plurality of banks, respectively, is connected to share one driver to reduce a junction loading due to drivers, thereby making it possible to improve a signal slop of a global input/output line.

Also, the present invention has an effect that it allows input/output sense amplifiers corresponding to a plurality of banks to share one driver to dispose only one driver per a plurality of banks, thereby making it possible to reduce a layout area occupied by the driver.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A semiconductor memory device comprising a plurality of couples of banks and a plurality of couples of sense amplifiers that amplify data transferred from the couples of banks and output the amplified signals, the semiconductor memory device comprising:
   a controller configured to determine the output states of amplified signals outputted from each sense amplifier of a couple of sense amplifiers and to output driving signals corresponding to the output states of the amplified signals outputted from the sense amplifiers of the couple of sense amplifiers; and
   a driver configured to receive driving signals and to drive a global input/output line in response to the driving signals,
   wherein the couple of sense amplifiers share the driver,
   wherein the controller is configured to perform NAND operating on the amplified signals outputted from a first sense amplifier corresponding to a first bank of a couple of banks and the amplified signals outputted from a second sense amplifier corresponding to a second bank of a couple of banks so as to combine the amplified signals and output the combined signals as the driving signals.

2. The semiconductor memory device as set forth in claim 1, wherein the driver is floated together with the global input/output line by the driving signals when the couple of sense amplifiers are turn-off and is driven in response to the driving signals when the amplified signal is transferred from any one of the sense amplifiers.

3. The semiconductor memory device as set forth in claim 1, wherein the each sense amplifier amplifies a pair of data transferred from each bank of the couple of banks, and the controller combines the first and second amplified signals outputted from the first sense amplifier and the third and fourth amplified signals outputted from a second sense amplifier and outputs first and second driving signals.

4. The semiconductor memory device as set forth in claim 3, wherein the second amplified signal is a signal opposite to the first amplified signal in view of a phase and the fourth amplified signal is a signal opposite to the third amplified signal in view of a phase.

5. The semiconductor memory device as set forth in claim 4, wherein the controller comprises:
   a first combination unit that enables the first driving signal based on a logic combination of the second and fourth amplified signals when the second and fourth amplified signals are in a first logic level; and
   a second combination unit that enables the second driving signal based on a logic combination of the first and third amplified signals when the first and third amplified signals are in the first logic level.

6. The semiconductor memory device as set forth in claim 5, wherein the first combination unit includes a first NAND gate that NAND-combines the second and fourth amplified signals and outputs the first driving signal.

7. The semiconductor memory device as set forth in claim 5, wherein the second combination unit comprises:
   a second NAND gate that NAND-combines the first and third amplified signals; and
   an inverter that outputs the second driving signal by inverting the output of the second NAND gate.

8. The semiconductor memory device as set forth in claim 3, wherein the driver comprises:
   a pull-up unit that pulls-up the global input/output line to a power source voltage level in response to the first driving signal; and
   a pull-down unit that pulls-down the global input/output line to a ground voltage level in response to the second driving signal.

9. The semiconductor memory device as set forth in claim 8, wherein the pull-up unit comprises a PMOS transistor that rises the global input/output line to the power source voltage level in response to the first driving signal, and wherein the pull-down unit comprises an NMOS transistor that falls the global input/output line to the ground voltage level in response to the second driving signal.

10. The semiconductor memory device as set forth in claim 1, wherein the first and second banks are arranged to be symmetrical to each other based on the arrangement region of the input/output sense amplifying circuit in which the first and second sense amplifiers are disposed.

11. The semiconductor memory device as set forth in claim 1, wherein the plurality of drivers share the one global input/output line, the global input/output line being provided with a latch.

12. A semiconductor memory device comprising:

an input/output sense amplifying circuit having a plurality of drivers;

a plurality of pairs of banks arranged to be symmetrical to each other with respect to the input/output sense amplifying circuit which is arranged between the pairs of banks;

a plurality of first sense amplifiers that amplify a first data transferred from any one bank of the pair of banks to provide it as a first amplified signal;

a plurality of second sense amplifiers that amplify a second data transferred from the other bank of the pair of banks to provide it as a second amplified signal; and a plurality of controllers that judge the output states of the first and second amplified signals to generate first and second driving signals corresponding to the output amplified signals, wherein each of the drivers is shared by each bank of a pair of the plurality of pairs of banks arranged to be symmetrical to each other, wherein the respective drivers drive the global input/output lines with the first and the second ,driving signals, and wherein the respective controllers configured to perform NAND operations generate the first and second driving signals corresponding to the first data when the first amplified signal is enabled and the first and second driving signals corresponding to the second data when the second amplified signal is enabled based on a combination of the first and second amplified signals.

13. The semiconductor memory device as set forth in claim 12, wherein each of the plurality of drivers shares one global input/output line, and each of the respective drivers is floated together with the global input/output lines when data are not transferred from the pair of banks shared and drive the global input/output lines when the data are transferred from any one of the pair of banks shared.

14. The semiconductor memory device as set forth in claim 13, wherein the global input/output line is further provided with a latch.

15. The semiconductor memory device as set forth in claim 12, wherein each driver comprises:

a pull-up unit that pulls-up the global input/output line to a power source voltage level in response to the first driving signal; and a pull-down unit that pulls-down the global input/output line to a ground voltage level in response to the second driving signal.

16. The semiconductor memory device as set forth in claim 15, wherein the pull-up unit comprises a PMOS transistor that rises the global input/output line to the power source voltage level in response to the first driving signal, and wherein the pull-down unit comprises an NMOS transistor that falls the global input/output line to the ground voltage level in response to the second driving signal.

17. The semiconductor memory device as set forth in claim 12, wherein each of the plurality of banks is arranged in a bank region divided into a quarter centering on the regions where input/output pads are arranged.

* * * * *